United States Patent
Luo

(10) Patent No.: US 8,191,246 B1
(45) Date of Patent: Jun. 5, 2012

(54) METHOD OF MANUFACTURING A PLURALITY OF MINIATURIZED SPRING CONTACTS

(76) Inventor: Qi Luo, San Jose, CA (US)

( * ) Notice: Subject to any disclaimer, the term of this patent is extended or adjusted under 35 U.S.C. 154(b) by 0 days.

(21) Appl. No.: 12/943,997

(22) Filed: Nov. 11, 2010

(51) Int. Cl.
*H01R 9/00* (2006.01)

(52) U.S. Cl. ......... 29/842; 29/843; 29/874; 324/756.03; 439/66

(58) Field of Classification Search ............ 29/842, 29/843, 874; 324/756; 439/66
See application file for complete search history.

(56) References Cited

U.S. PATENT DOCUMENTS

| | | | | |
|---|---|---|---|---|
| 5,476,211 | A | * | 12/1995 | Khandros ............... 228/180.5 |
| 5,772,451 | A | * | 6/1998 | Dozier et al. ............... 439/70 |
| 6,215,670 | B1 | * | 4/2001 | Khandros ................. 361/774 |
| 6,274,823 | B1 | * | 8/2001 | Khandros et al. .......... 174/261 |
| 6,615,485 | B2 | * | 9/2003 | Eldridge et al. ............ 29/843 |
| 7,200,930 | B2 | * | 4/2007 | Khandros et al. .......... 29/860 |
| 2001/0044225 | A1 | * | 11/2001 | Eldridge et al. ............ 439/66 |

* cited by examiner

*Primary Examiner* — Carl Arbes

(57) ABSTRACT

A method of manufacturing an array of miniaturized spring contacts is disclosed. The invention teaches a symmetric design of the spring contact with two anchoring traces at each side of the spring contact, and teaches a method of forming the spring contact with a continuous, zero-stress core member throughout the entire body of the spring contact; besides these, the invention enables easy manufacturing of integrated fine pitch spring contact arrays, allows fabrication of such spring contact arrays with extremely uniform spring height and good electrical and mechanical properties.

13 Claims, 9 Drawing Sheets

METHOD OF MANUFACTURING A PLURALITY OF MINIATURIZED SPRING CONTACTS

FIELD OF THE INVENTION

The present invention relates to miniaturized spring contacts manufactured using micro-electronic-mechanical-systems (MEMS) fabrication techniques, and particularly to miniaturized spring contacts in application of bonding and testing of semiconductor integrated circuitry (IC) devices.

BACKGROUND OF THE INVENTION

Semiconductor devices, such as integrated circuitry (IC), are massively manufactured by fabricating hundreds or even thousands of identical circuitry on a single semiconductor wafer, and hundreds or thousands of such wafers daily using photolithography in combination with various other material additive and removal processes. After being fabricated, these semiconductor devices are subsequently electrically connected to external electrical testers through electrical contact devices, such as probe cards, so that they can be tested.

An electrical contact device, such as probe card, is an integral part of connecting device to connect IC devices on semiconductor wafer to external electrical components, such as a tester etc. One key component of the electrical contact device is the mechanical and electrical contact structure which makes the physical and electrical contact to the IC device on the semiconductor wafer. There are several standard contacts for the probe cards, including the epoxy ring contact, the blade contact, and the micro-spring contact. The epoxy ring contact and the blade contact are traditional contacting technologies, and the micro-spring contact is an emerging new technology which makes fine mechanical and electrical contacts using micro-electrical-mechanical-systems (MEMS) fabrication techniques, which are well known by those skilled in the art. While probe cards made from these standard contact technologies have adequately worked in the past, the trend in semiconductor IC testing is to use smaller and smaller electrical contacts to accommodate the greater number of circuitry on the semiconductor substrates. This poses difficulties for traditional epoxy ring contact and blade contact technologies, and also poses desires for improvement and new designs of the micro-spring contact technology.

An example type of fine pitch micro-spring contact is described in U.S. Pat. No. 5,613,861 to Smith et al. entitled "Photo lithographically Patterned Spring Contact", which discloses a spring contact formed of a thin stressed metal stripe which is in part fixed to a substrate and electrically connected to a contact pad on the substrate. The free portion of the metal stripe not fixed to the substrate bends up and away from the substrate due to the intrinsic stress gradient inside the thin metal stripe. When the testing pad on a device is brought into pressing contact with the free portion of the metal stripe, the free portion deforms and provides compliant contact with the testing pad. The contact pad on the substrate is electrically connected to the testing pad on the device via the spring contact. A typical embodiment of the stress metal spring contact is schematically shown in FIG. 1a. The spring contact comprises an anchor portion 101 associated with an electrical contact or terminal 102 attached to a substrate or electrical component 103, and a free portion 104 with a spring tip 105. Another similar example is described in U.S. Pat. No. 7,126,220 to Lahiri et al. entitled "Miniaturized Contact Spring", which also uses the stressed metal to form the core part of the spring contact, and discloses a method of increasing the yield strength and fatigue strength of miniaturized spring contacts by electroplating the spring contacts with high elastic modulus metal materials. Both disclosures are herein incorporated as references. This type of spring contacts may be used for fine pitch probe card applications. However, this type of spring contacts intrinsically suffers from some process deficiencies. First, the core part of this type of spring contacts is composited of a plurality of differently stressed films to have a stress gradient in the z-direction, yet to have overall neutral stress in plane. This brings the concern of stress control. Second, the released springs, prior to the electroplating, are fragile and easy to fracture during the following process. Third, the large tension force applied on the spring contacts during testing creates large stress on the spring bases anchored on the substrate, therefore causes tendency of de laminations and other failures, and raises concerns of reliability.

Another example type of fine pitch spring contacts by lithographical and MEMS fabrication techniques is U.S. Pat. No. 6,268,015 to G. Mathieu et al., U.S. Pat. No. 6,184,053 to B. Eldridge et al., and other patents issued to the same group, which discloses a method to form cantilever type discrete spring contacts by selectively removing and adding desired building blocks to form spring contacts. The spring contacts are fabricated individually or in a group and subsequently mounted on a functional substrate, such as semiconductor testing devices. FIG. 1b is a schematic cross-sectional view of such a cantilever type spring contact. The spring contact comprises of a tip 201 which is attached to a free standing element 202 which at one end is attached to a post 203, which is attached to an electrical contacting terminal 204, which is positioned on a functional substrate 205. Upon testing of an external device, the tip 201 is pressed on the testing pad on the external device, therefore the free standing portion 202 compliantly deforms. This invention avoids the use of highly stressed films. The problem of this type of spring contacts is that the spring contacts are too long. Shorter and smaller spring contacts are desirable for testing of new generations of IC devices. This type of spring contacts also raises concern of mechanical failure as the building blocks are only adhered together through adhesion.

In above two types of spring contacts, a spring contact has a tip at the end of the free standing portion, and an anchoring portion on the substrate at the other end of the spring contact. During operation of testing, the tip is pressed, and the spring is elastically deformed. The anchoring portion experiences high stress, therefore raises concern of the adhesion reliability of the anchoring portion. At semiconductor IC testing, a miniaturized spring contact, in its lifetime, is subjected to a large number, for example one million times, of contacting operations which subject the spring contact to various levels of stresses. A spring contact is required to withstand such stresses without failure.

Therefore, what is desired is a mechanism for maximizing spring contact reliability, especially the adhesion to the substrate, and maximizing the yield strength and fatigue strength of the miniaturized spring contact within the miniaturization requirement.

What is further desired is a method of easy manufacturing of such high performance array of spring contacts, without sacrificing any of the desired features.

The invention herein comprises several means to circumvent the problems associated with the above two types of spring contacts and provides solutions that allow easy manufacturing of spring contact arrays suitable for meeting the stringent requirements of wafer level IC testing. For example, it teaches a symmetric design of a spring contact with two anchoring portions to improve reliability performance; it also teaches a method of forming the spring contact using a continuous, zero-stress core member through the entire spring contact; besides these, the invention enables easy manufacturing of integrated fine pitch spring contact arrays, allows fabrication of spring contact arrays with extremely uniform spring height and other desired properties, as well as durability.

BRIEF SUMMARY OF THE INVENTION

In general, it is the object of the present invention to provide a miniaturized spring contact and an array of such miniaturized spring contacts that employ great compliance, great spring integrity, good electrical conductivity, fine dimensions, easy fabrication, and great reliability.

A further object of the invention is to provide a method of bonding a device through an array of the miniaturized spring contacts to an external semiconductor device.

A further object of the invention is to provide a probe card that uses an array of the miniaturized spring contacts.

In accordance with the above objects, the invention provides structural designs of such miniaturized spring contact and a wafer scale process of making an array of such miniaturized spring contacts; and the invention also provides embodiments of using such array of miniaturized spring contacts in the device bonding application and in probe card wafer testing application.

In an example embodiment, a substrate consists of two bonded silicon wafers: a prime silicon wafer A, and another prime silicon wafer B which has an embedded plurality of through wafer electrical connections, and a buried $SiO_2$ layer in the bonding interface between wafer A and wafer B. A masking dielectric layer, such as Si3Ni4 layer, is coated on the top of the silicon wafer A and patterned thereafter. A timed Si etch is then conducted, to etch a layer of the top Si away; then another layer of the masking dielectric layer is coated, and then patterned, and then another Si etch is conducted and reaches the embedded $SiO_2$, which acts as a Si etch stop layer. After that, the masking dielectric layer is removed, and another masking layer, such as photoresist, is coated and patterned thereafter, and an etch is conducted to the embedded $SiO_2$ layer, to open the embedded plurality of through wafer electrical connections. After that, a stack of metal layers is coated, and patterned to form the routing metal traces. The routing metal traces connect the through wafer electrical connections with the later formed spring contact structures. After the routing metal traces are formed, a dielectric layer, such as $SiO_2$ or polyimide, is coated, and then patterned to form VIAs, and then another stack of metal layers, called spring metal, is coated and patterned to form the desired spring structures (un-released). After that, the desired spring structures are released by dissolving the entire leftover Si material of the wafer A. At this moment, an array of spring structures is formed. After that, a plurality of metal layers is plated, either by electroplating or electroless plating. The plated metal layers are aimed to enhance the mechanical strength as well as the electrical conductivity of the spring structures. After plating, a spring structure, together with the other formed features, becomes a spring contact.

In above embodiment of the present invention, the aspect of the routing metal layer allows the flexibility of have large number of fine spring contacts in a small area by routing the electrical connection of the spring contacts to a much larger area to connect to the available through substrate electrical connections.

In a deviation of above embodiment of the present invention, prior to releasing the spring structures, a first plurality of metal layers may be plated by electroplating or electroless plating, then the spring structures are released by dissolving the entire leftover Si material of the wafer A, and a second plurality of metal layers is then plated, either by electroplating or electroless plating. The plating of the first plurality of metal layers increases the mechanical strength of the spring structures so that they withstand the releasing process.

In another embodiment of the present invention, a particular application of the spring contacts of the present invention in device bonding is disclosed. A functional substrate, for example a semiconductor device, having a plurality of the spring contacts is permanently bonded with another active semiconductor device, with the spring contacts connected with the electrical terminal pads on the active semiconductor device. The spring contacts provide compliance to the bonded assembly.

In another embodiment of the present invention, a particular application of a probe card using the spring contacts is disclosed. The probe card includes a plurality of spring contacts of the present invention. The spring contacts of the probe card may be temporarily electrically connected to at least one testing pad of the external electrical device which is coupled to circuitry thereof The spring contacts may also contact all of the testing pads of the external electrical device to test all of the circuitry of the external electrical device at substantially the same time, thus eliminating the need to test the circuitry in sections.

The present invention, in a number of embodiments, provides spring contacts, methods of manufacturing the spring contacts, and methods of utilizing the spring contacts in various applications. The spring contacts of the present invention may be used as electrical contacts in probe cards, and many other applications that require a fine array of compliant electrical and mechanical contacts. These features, advantages, and alternative aspects of the present invention will be apparent to those skilled in the art from a consideration of the following detailed description in combination with the accompanying drawings.

DETAILED DESCRIPTION OF THE INVENTION

The following detailed description is directed to certain specific embodiments of the invention. In the description, reference is made to the drawings wherein like parts may be assigned with like numerals throughout. Also, for ease of description, the dimensions of the parts are not to the scale. Because of this, important dimensions are given in values throughout the whole description of the embodiments.

The present invention provides a spring contact that possesses pre-determined mechanical strength and electric conductivity. Normally, at non-operational state, a spring contact is at un-stressed condition and no deformation is created; in the situation that the spring contact is pressed against the testing pad of a semiconductor device on a semiconductor wafer, the spring contact elastically deforms, and this deformation provides certain required force to make a good mechanical contact to the testing pad. Once a stable mechanical and electrical contact to the testing pad is made, the testing signal from the tester can be delivered, through the spring contact, to the testing pad therefore to the semiconductor device.

In one embodiment, for example, a spring contact has a tip which has a head pointing to the up-right direction and two feet each connected to a horizontal beam at one end, and each of the two horizontal beams is connected at its other end to a tilted beam at its upper end, and each of the two tilted beams is connected at its low end to a trace which adheres to a substrate. All these building blocks possess a continuous core metal through the entire spring contact and a continuous coated envelope metal at the outer. The core metal is made from one stack of deposited films and the outer-metal is made from another stack of electroplated or electroless-plated metal layers. This design with continuous core and continuous outer allows good mechanical integrity of the spring contact.

In another embodiment, a probe card apparatus comprises of an array of spring contacts. This probe card, upon being pressed against an integrated circuitry semiconductor wafer, can make mechanical and electrical contacts between every spring contact and a corresponding testing pad of the semiconductor wafer. As thousands of such spring contacts can be made on one probe card, therefore it is possible to fulfill wafer scale testing at one touchdown.

Figure 1A:
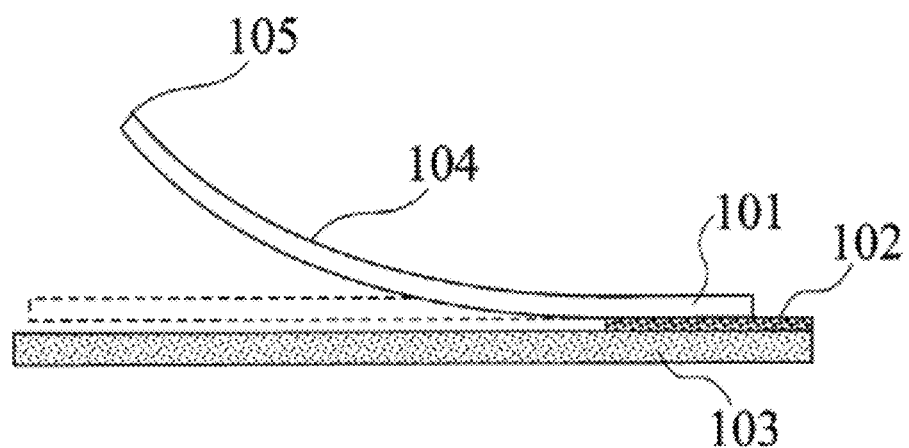
FIG. 1a is a schematic diagram illustrating a typical stress metal film type spring contact according to the prior art.
Figure 1B:
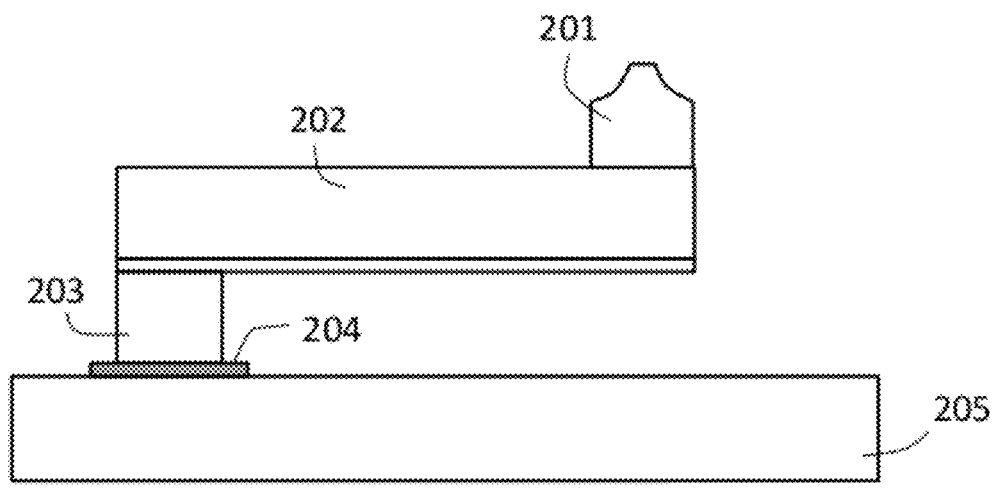
FIG. 1b is a schematic diagram illustrating a typical cantilever type spring contact according to the prior art.
Figure 2A:
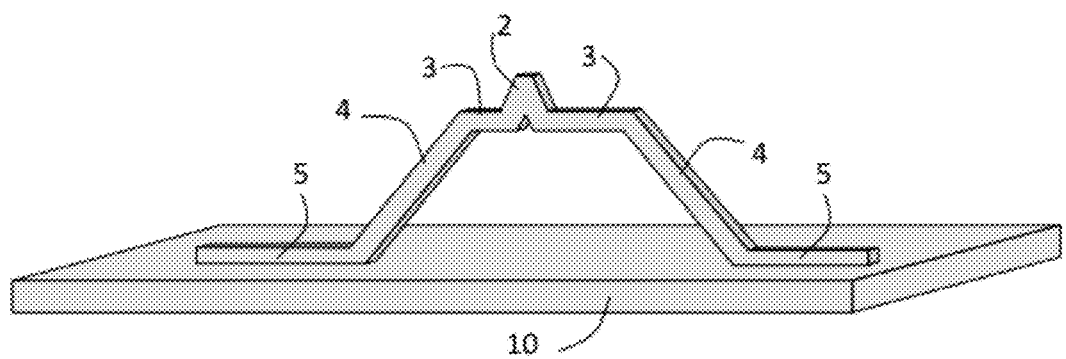
FIG. 2A illustrates an isometric view of a spring contact.
Figure 2B:
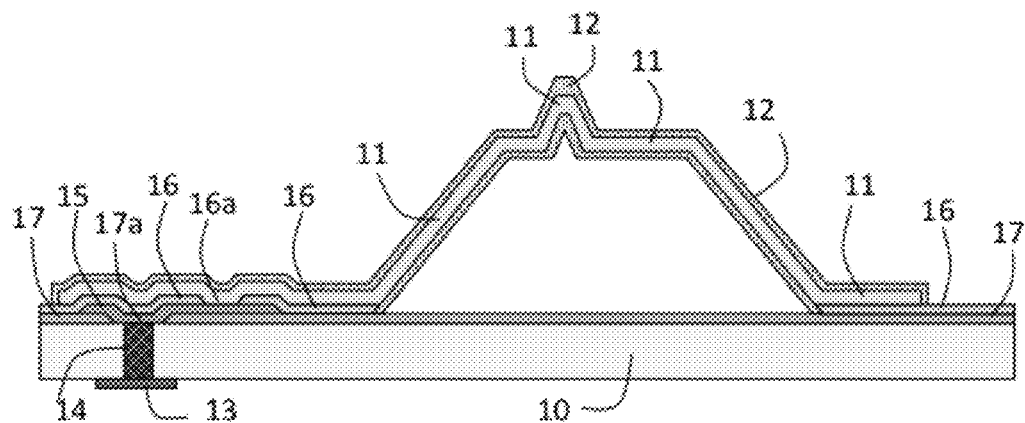
FIG. 2B illustrates a cross-sectional view of a spring contact.

An exemplary embodiment of the spring contact is shown in FIG. 2A and FIG. 2B. FIG. 2A is an isometric view of a spring contact, and FIG. 2B is a cross-sectional view of a spring contact. In FIG. 2A, the top portion 2 of the spring contact is the tip of the spring. The tip points up vertically, and splits at the low end. Each of the split is connected to one end of a horizontal beam 3. Each of the horizontal beams 3 is connected at its other end to a tilted beam 4 at its upper end, and each of the two tilted beams 4 is connected at its lower end to a trace 5 which adheres to a substrate 10.

Substrate 10 may be of silicon, ceramic or other substrate material, with embedded through substrate electrical connects, which are not shown here in FIG. 2A. The through substrate electrical connect is to make an electrical connection from the backside to the spring contact at the front side. Tip 2 is the contacting point of the spring contact. It contacts the testing pad on a semiconductor wafer to be tested. Beams 3, 4, and trace 5 all have one or more layers of metal to provide electrical conductivity; beams 3, 4 also have good elastic properties, so that upon being pressed at tip 2, beams 3, 4 can elastically deform and provide the desired spring force. For easy description, below two concepts are used: spring and spring contact. A spring contact means the structure comprising the building blocks of tip 2, beams 3, beams 4, and traces 5; a spring means the suspended structure comprising the building blocks of tip 2, beams 3 and beams 4 only.

FIG. 2B is a cross-sectional view of the spring contact. With this view, the layered structure of the spring contact is partially revealed. Inside the material that forms the spring contact, there is a core part 11, which is a plurality of metal or metal alloy layers, such as one or more of Ti, Mo, MoCr, W, Ni, Au, etc. This core part 11 is called spring metal, and it is presented continuously through the entire spring contact. At the portions where the spring contact attaches to the substrate, the core part 11 is adhered to a dielectric layer 16 which adheres to another dielectric layer 17 which then adheres to the substrate 10. The outer part 12 of the spring may be one or more of envelope layers, which is plated on through electroplating or electroless plating; it may be one or more of the Au, Ni, or Ni alloy, Rh, Pd or Pd alloy etc. Its purpose is to enhance the mechanical strength as well as the electrical conductivity of the spring contact. Inside substrate 10 there is a through-substrate electrical conductive plug 14 which electrically connects the spring contact at the front surface of substrate 10 to the contact pad 13 at the backside of substrate 10. There is a routing metal layer 15 at the front side to help connect the through-substrate electrical conductive plug 14 to the core member 11 of the spring contact.

In the above embodiment, there are 3 VIAs to make the connection from pad 13 at the backside of substrate 10 to the spring contact at the front side. The first is VIA 14, which connects pad 13 at the backside to the front side of substrate 10; the second is VIA 17a, which connects VIA 14 to the routing metal 15; the third is VIA 16a, which connects the routing metal 15 to the spring metal 11.

Figure 2C:
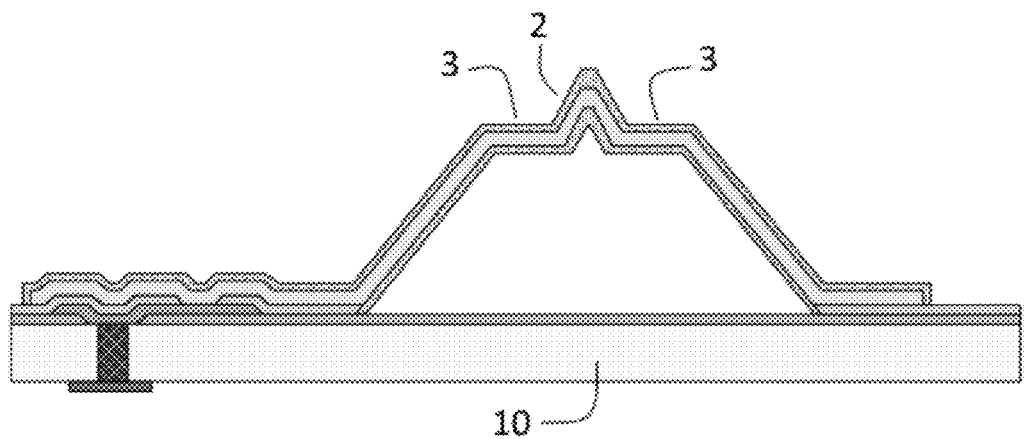
FIG. 2C illustrates an embodiment of a spring contact with a symmetric design.

In above embodiment shown in FIG. 2A, the two beams 3 at each side of tip 2 may have different length, with one being the T times of the other. T may be any number between 0 and 1. While T is 0, one beam 3 disappears and the tip sits at the side; while T is 1, the two beams 3 are of the same length and tip 2 sits in the center of the spring. FIG. 2C shows another embodiment, where the two beams 3 are of the same length, and the spring contact has a symmetric design of its free standing portions.

In the embodiment shown in FIG. 2A, tip 2 is not in the center of the spring. While the spring contact is pressed against a testing pad of another semiconductor wafer, the force applied on the tip 2 forces the spring to deform non-symmetrically. The tip would displace along the vertical direction (z direction) as well as along the horizontal direction (x-y direction). The combination of the vertical and horizontal displacements would emulate a scrubbing action similar to those happening in the spring contacts disclosed in the previous discussed prior arts.

In the embodiment shown in FIG. 2C, tip 2 is in the center of the spring, and the spring is symmetric. While the spring is pressed at tip 2, the spring moves along vertical direction only. No transversal displacement happens. This is in favor of making a static contact, for example in the case that the testing pads, which the spring contacts make contact to, are of solder pads.

FIG. 3A through 3K (collectively referred as FIG. 3 hereafter) schematically illustrate an embodiment of a method for fabricating an array of such spring contacts using conventional semiconductor and MEMS manufacturing techniques such as film deposition, lithography, etching etc. This process is collectively named as process 300. For simplicity, in FIG. 3 only one representative spring contact is drawn while actually an array of such spring contacts maybe formed simultaneously.

Figure 3A:
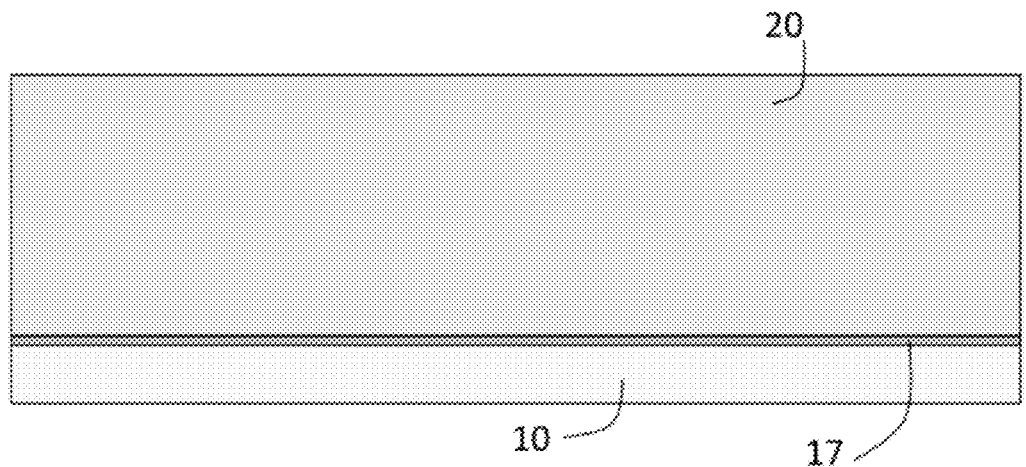
FIGS. 3A-3K illustrate a method of making an exemplary spring contact array according to the present invention.

The process 300 starts with FIG. 3A, where two silicon wafers are bonded together with a layer of $SiO_2$ in the bonding interface. The top silicon wafer 20 may be of a prime intrinsic silicon wafer, or other type of prime silicon wafer, such as (110), (100) oriented wafer, which is to facilitate silicon anisotropic etch. Its thickness is in a range from 100 μm to 500

μm, preferably 250 μm. The bottom silicon wafer 10 may be of a highly doped silicon wafer, which is for the purpose to build through wafer electrical connect. The thickness of wafer 10 is in a range from 100 μm to 1000 μm, preferably 500 μm.

Figure 3B:
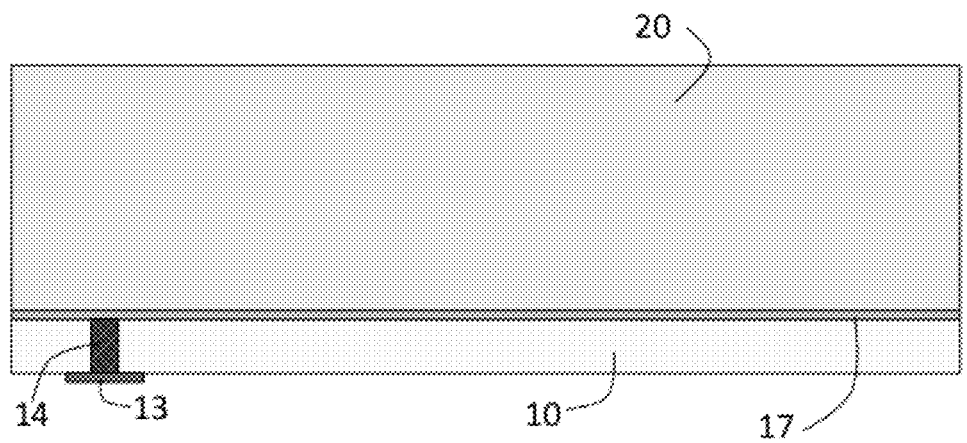

The process 300 continues at FIG. 3B, where a plurality of through wafer electrical connect are made at the bottom silicon wafer 10. This can be done by standard silicon ICP etch to produce a plurality of circular trenches, each leaving a cylindrical silicon rod at the center. This etch stops at the $SiO_2$ at the bonding interface. After the etch, a thermal oxidation process is performed to form a $SiO_2$ layer on the wall of the trenches, then polysilicon is deposited and thermally oxidized to fill the trenches with $SiO_2$. After the trenches are filled, a CMP may be conducted to planarize the surface. This technique of making trenches then re-filled with $SiO_2$ is well understood by those skilled in the art, and as it is not the focus of the current invention, no further detailed description of fabrication is provided here. Therefore, only the outcome result is illustrated which is a plurality of through wafer electrical connects 14. After that, a metal layer is deposited and then patterned to form a plurality of contacting pads 13 at the bottom surface. For routing purpose, contacting pad 13 may or may not be directly under the through wafer connect 14.

Figure 3C:
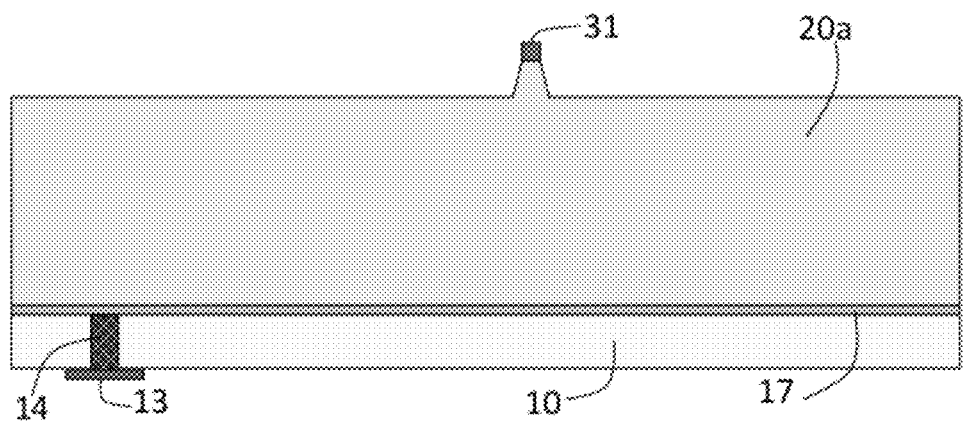

After the plurality of through silicon wafer electrical connects are made, the process 300 continues to FIG. 3C. A layer of $SiO_2$ or $Si_3N_4$ or metal is deposited on top of the top silicon wafer, and is patterned by photolithography into a plurality of a desired pattern 31. Pattern 31 defines the size of the tip of the spring contact. After pattern 31 is formed, a timed Si etch is performed, to etch a top layer of the Silicon off. This leaves the substrate 20 to be its new shape 20a. The Si etch can be done by dry etch, or a silicon anisotropic wet etch. With dry etch, the slope angle can be well controlled to the desired, yet with Si anisotropic wet etch, the angle is determined by the silicon etching characteristic. The depth of this etch can be 10 μm to 100 μm, preferably around 50 μm. The width of the tip at the top would be between 5 μm-100 μm, preferably 30 μm. After the etch the masking material $SiO_2$, $Si_3N_4$, or metal is removed by a wet etch.

Figure 3D:
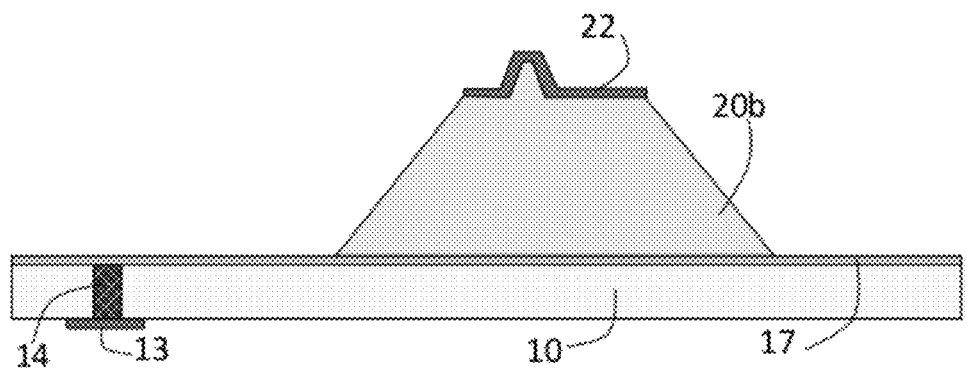

After the masking $SiO_2$, $Si_3N_4$ or metal layer is removed in FIG. 3C, the process 300 continues to FIG. 3D. Another masking layer of $Si_3N_4$ or metal is deposited on the top silicon wafer, and is then patterned to form the mask 22. After that, a Silicon anisotropic wet etch is performed to etch the silicon away all the way down to the $SiO_2$ layer 17 at the bonding interface. This forms the characteristic sloped angle as shown in FIG. 3D and leaves the substrate 20 into its new shape 20b.

Figure 3E:
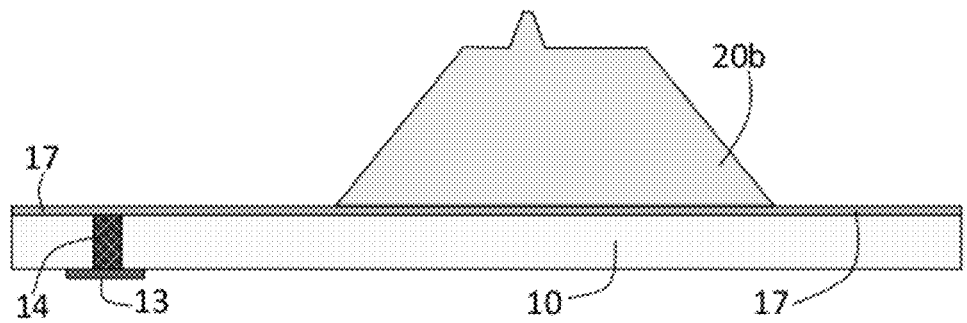

The process 300 continues to FIG. 3E. After the silicon anisotropic wet etch, the masking layer $Si_3N_4$ or metal is removed by a wet etch. This exposes the surface of the substrate which now comprises a plurality of structures 20b sitting on top of the silicon wafer 10. The structure 20b has a desired contour shape on which later forms the spring of the present invention.

Figure 3F:
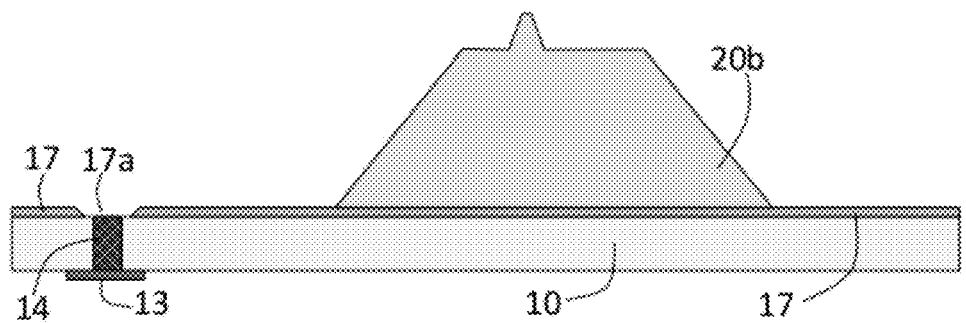

The process 300 continues to FIG. 3F. After the masking $Si_3N_4$ or metal layer is removed, a photolithography process is performed and then a $SiO_2$ etch is conducted to open $SiO_2$ layer 17 and form a plurality of VIAs 17a. Each VIA reveals a through-wafer electrical connect 14.

Figure 3G:
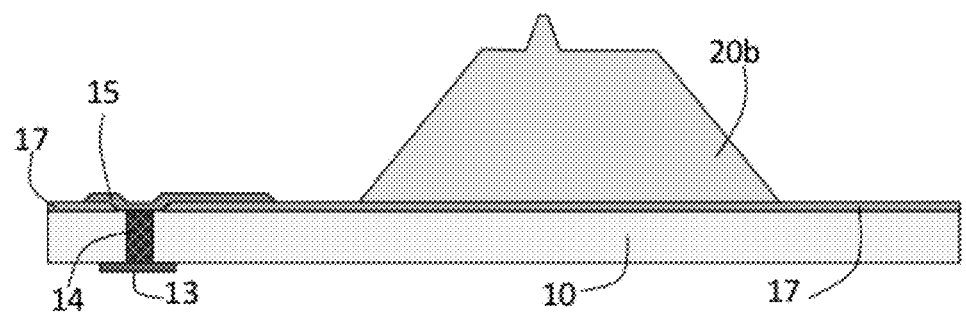

The process 300 continues to FIG. 3G. After the plurality of VIAs 17a is made, a stack of metal layers, which later forms a plurality of routing metal traces 15, is coated on top of the substrate, which now has the desired plurality of structures left whose contour shape later forming the springs and also has the through-wafer electrical connects 14 revealed. This stack of metal layers may be of Ti, Cr, Mo, MoCr, Au etc. Its purpose is to route the through wafer electrical connects 14 to desired areas where the spring contacts may be formed. This metal stack is called routing metal thereafter. The routing metal is patterned into a plurality of routing metal traces 15 by photolithography and etch.

Figure 3H:
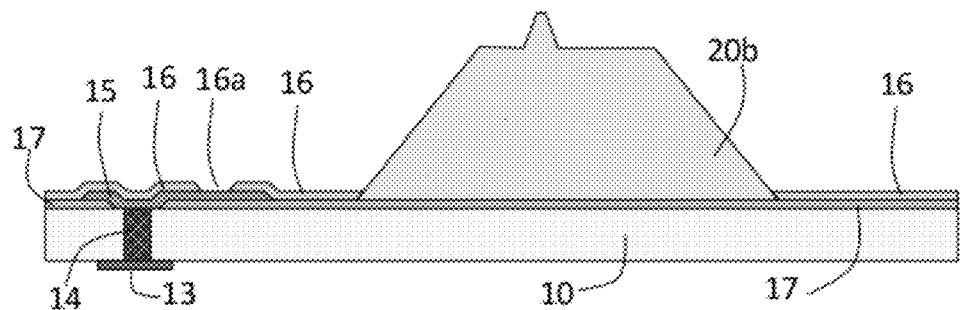

The process 300 continues to FIG. 3H. After the routing metal traces 15 are formed, another $SiO_2$ layer 16 is deposited, and then is patterned into desired structure by photolithography and etch, and also forms a plurality of VIA 16a, which reveals the routing metal at desired locations, where later the spring metal may make connections to the routing metal traces 15.

Figure 3I:
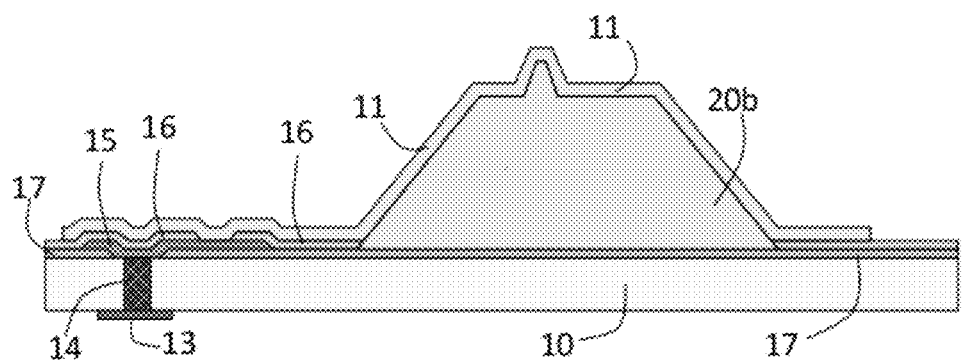

The process 300 continues to FIG. 3I. A stack of metal layers, which will be used to form the core member of the spring contact, is deposited on top of the substrate, now having the desired structure 20b and VIA 16a formed. This stack of metal layers is called spring metal. The spring metal layers may be of Ti, Cr, Mo, Mo alloy, Au etc. An example embodiment would be Ti as an adhesion layer, Mo or Mo alloy as the core layer and Au layer on top to facilitate the following plating process. The deposition may be carried out by physical vapor deposition (PVD), chemical vapor deposition (CVD), atomic layer deposition (ALD) or electron-beam evaporation, etc. The stress of the spring metal, especially the stress of the core layer, should be controlled to be close to zero. After the spring metal is formed, it is then patterned into a plurality of spring metal stripes 11 by photolithography and etch. Each spring metal stripe 11 is connected at the end to a VIA 16a formed on the dielectric layer 16, which is formed at step FIG. 3H.

Figure 3J:
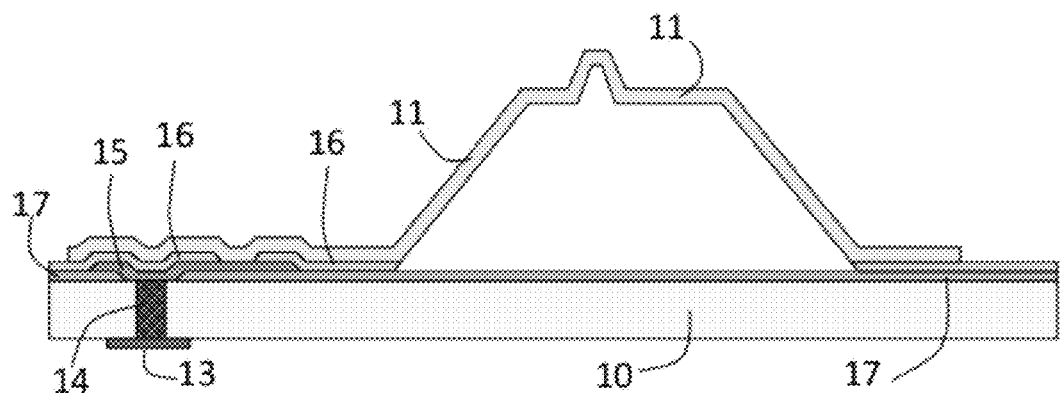

The process 300 continues to FIG. 3J. After the spring metal is patterned to form the plurality of spring metal stripes 11, a silicon etch is performed to remove the plurality of structures 20b. This leads to the spring metal stripes 11 being partially suspended, with the two ends of each metal stripe adhered to the bottom silicon substrate. After this, the plurality of spring metal stripes forms a plurality of released springs.

Figure 3K:
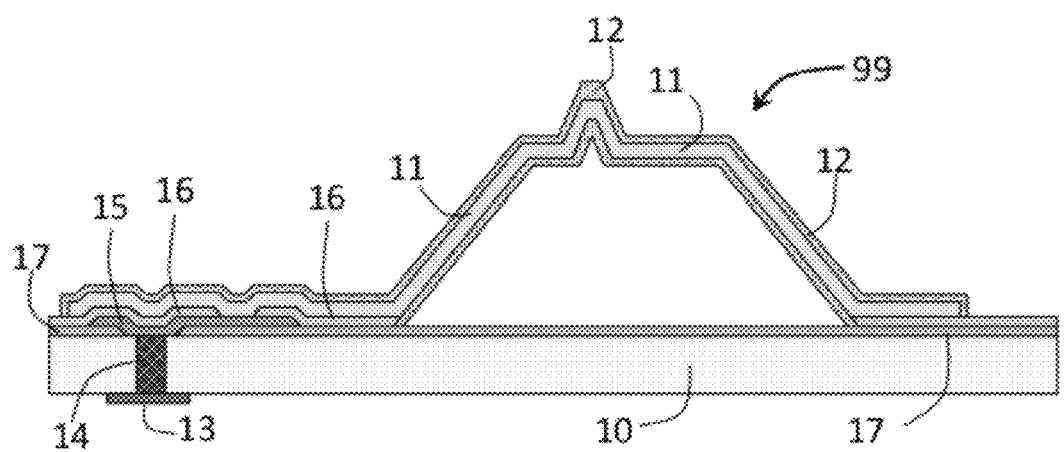

The process 300 continues to FIG. 3K. After the plurality of springs is released, the springs are still very fragile and have very small spring constant. In order to make them strong, a stack of metal layers 12 is coated onto the entire springs and also the traces on the substrate by electroplating or electroless plating. The coated metal layers typically have high young's module, resulting in relatively stiff springs. The material can be one or more from the group of Ni, Co, Au or their alloy, and Pt, Pd, Rh. The coating of the metal layers enhances the mechanical strength as well the electrical conductivity of the springs. After this step, a plurality of spring contacts 99 is formed.

The example process 300 may be deviated after process step illustrated in FIG. 3I is completed, where the spring metal is patterned into a plurality of spring metal stripes 11. After the spring metal stripes 11 are formed, a first plating is conducted with a stack of metal layers being plated onto the spring metal stripes 11 by electroplating or electroless plating. This first plated metal stack may be one or more layers of Au, Au alloy, Ni, Ni alloy etc. After this first plating, the process continues to process step illustrated in FIG. 3J and FIG. 3K for silicon dissolving and then a second plating by electroplating or electroless plating of the desired metals, which is one or more from the group of Ni, Co, Au or their alloy, and Pt, Pd, Rh. The purpose of the first plating is to enhance the mechanical strength of the spring metal stripes so that the spring metal stripes can withstand the subsequent releasing process.

It should be noticed that, in above example preferred process 300 and its deviation process of forming a plurality of spring contacts, the tip position of each spring contact is purposely set to be off-centered. This is to facilitate the in-plane scribing fact while the compliant spring contact is pressed against a testing pad on a semiconductor wafer. The in-plane scribing can help the tip to break the oxide barrier layer on the testing pad so that good electrical contact can be formed between the spring contact and the testing pad. It is understood that in some other embodiments, the tip may be placed in the center of the spring therefore the free-standing portion of the spring contact is symmetric. It is also understood that various omissions, substitutions and changes to the diagraph process illustrated above may be made by those skilled in the art without departing from the spirit of the invention.

It should also be noticed that, in above example preferred process 300 and its deviation process of forming spring contacts, the details of specific film deposition, photolithography, etching, and plating are not discussed. It is assumed that these details are well understood by those skilled in the art.

Figure 4:
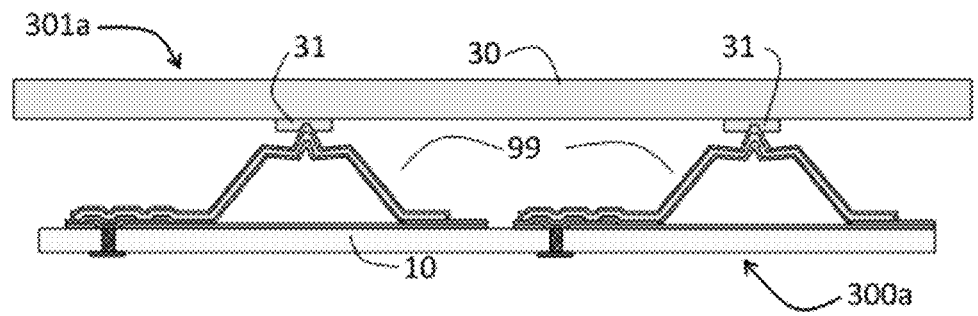
FIG. 4 schematically illustrate a device assembly utilizing the spring contacts of the present invention to bond with another electrical device.

Referring to FIG. 4, in one particular application, device 300a has a substrate 10 which maybe of a semiconductor material with embedded electrical through wafer connects, and an array of the spring contacts 99 fabricated on substrate 10. Device 301a comprises a substrate 30 and an array of testing pads 31 on the substrate 30. Substrate 30 may be a semiconductor wafer with built-in high level devices, or may be a carrier substrate, such as a PCB, which may have electrical connections to other high level devices. In FIG. 4, device 300a is permanently connected with device 301a through the spring contacts 99 and the testing pads 31. This allows the electrical communication between device 300a and device 301a. The array of terminal pads 31, being formed from a solder wettable material or having a solder wettable metallization layer, may be used to provide permanent electrical connections with the high-level built-in devices in substrate 30. The spring contacts 99 may be connected to testing pads 31 by stenciling or screening bricks of solder material on the terminal pads 31 and heating the assembly of substrate 10 and substrate 30 with the two components fixed in place at a temperature sufficient to cause the bricks of solder to reflow, as is commonly known in the art. If substrate 10 or 30 expands or contracts at different rates due to thermal stresses and different CTEs, spring contacts 99 may compliantly deflect to accommodate the mismatch. This ability to accommodate thermal stresses helps prevent fracturing of the spring contacts 99, their respective solder joints to terminal pads 31, or both.

Figure 5:
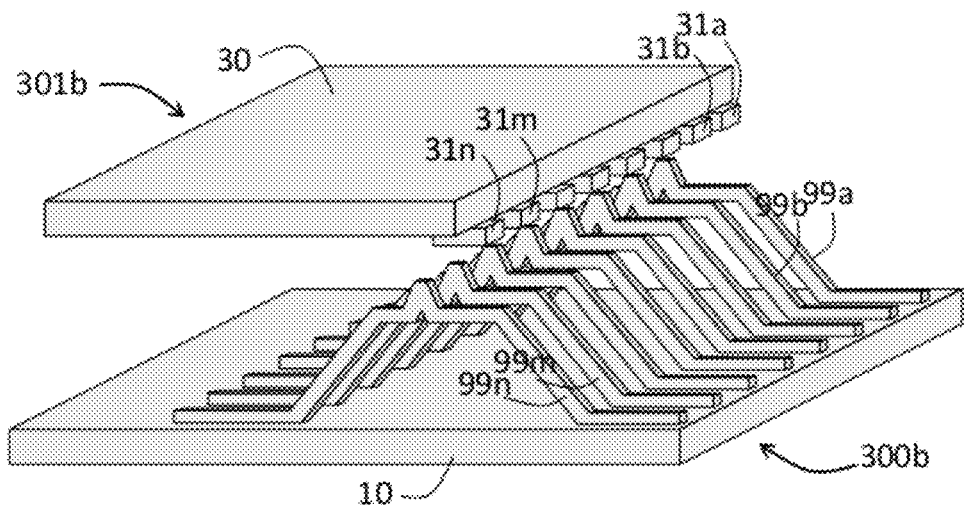
FIG. 5 illustrates a probe card utilizing an array of the spring contacts of the present invention to test a semiconductor wafer.

FIG. 5 shows another use of the spring contacts of the present invention in probe cards application. A probe card, having an array of the spring contacts, may be used to make temporary electrical connection between the tester and the device to be tested. Testing of semiconductor devices using probe cards is common in the semiconductor industry, where the probe cards are used to test semiconductor dice while the dice are still part of a wafer. FIG. 5 shows an exemplary embodiment where the probe card 300b has an array of spring contacts 99a to 99n used in place of the standard probe needles. The probe card 300b operates identically to a standard probe card used in the semiconductor industry except for having spring contacts 99a to 99n in accordance with the present invention. The probe card 300b is aligned with the semiconductor device 301b (e.g., a silicon wafer or semiconductor die having integrated circuitry thereon)such that the spring contacts 99a to 99n compliantly contact the corresponding bond pads 31a to 31n on the semiconductor device 301b. The semiconductor device 301b is then tested or communicated with a testing device electrically connected to the probe card 300b. The substrate 10 of the probe card 300b is preferably formed from silicon containing circuitry thereon to distribute test signals to and from each semiconductor device 301b to be tested. By forming the substrate 10 from silicon, the CTE difference between the probe card 300b and the semiconductor device 301b (typically made from a silicon wafer) to be tested is minimized. Furthermore, wafer probe testing and burn-in testing of the semiconductor device 301b may occur over a wide temperature range between 125° C. to −55° C.; thus, minimizing the CTE difference between the probe card 300b and the semiconductor device 301b is particularly important on wafer-level testing due to the large dimensions of the wafer. The probe card 300b may also be fabricated having enough spring contacts 99a to 99n to contact all of the testing pads of a particular semiconductor wafer 301b being tested. The testing signals may be distributed either all at once or sequentially to the device 301b through the spring contacts 99 on the probe card 300b. This eliminates having to test a semiconductor wafer in sections due to not having enough electrical contacts, thus, improving process throughput.

While the above detailed descriptions have shown novel features of the invention in various embodiments, it is understood that various omissions, substitutions, and changes may be made to the forms and details of the illustrated devices or processes by those skilled in the art without departing from the spirit of the invention. Many variations in light of the described embodiments herein will be appreciated by those skilled in the art.

What is claimed is:

1. A method for manufacturing a plurality of miniaturized spring contacts on a substrate, said spring contacts each comprising an electrically conducting core member being stress-free and continuously presented through each entire spring contact, and a coating layer enveloped on all exposed surface of said core member, said core member having a tip portion pointing up vertically at the farthest distance away from the substrate, said tip portion split into two first tilted portions, said first tilted portions each extended to a horizontal portion, said horizontal portion each extended to a second tilted portion, said second tilted portion each further extended to a horizontal trace, said horizontal trace each being anchored on the said substrate, and one said horizontal trace being connected to a through substrate electrical connect, the method comprising the steps of:

bonding a first prime silicon wafer with a second highly doped prime silicon wafer with a bonding SiO$_2$ layer in the bonding interface; and forming a plurality of through wafer electrical connects on said second highly doped silicon wafer; and forming a plurality of spring contour shapes using a variety of techniques, said spring contour shapes each having a outstanding portion at top, a plateau next to each side of said outstanding portion, a slope next to each said plateau, and a base next to each said slope, the top of said bases is said bonding SiO$_2$ layer; and forming a plurality of first openings on said bonding SiO$_2$ layer to reveal said through wafer electrical connects; and forming a plurality of routing metal traces to connect to said through wafer electrical connects through said first openings; and forming an insulating layer and a plurality of second openings in said insulating layer to reveal said routing metal traces; and forming a plurality of spring metal stripes over said plurality of spring contour shapes, said spring metal stripes each becoming said core member of one said spring contact; and releasing said plurality of the spring metal stripes by dissolving the underlying leftover material of said first prime silicon wafer; and electroplating or electroless plating of said plurality of the spring metal stripes with one or more layers to envelope all exposed surface of said plurality of the spring metal stripes.

2. The method of claim 1, wherein the height of said spring contacts is in the range of 50 μm to 500 μm, and the width in the range of 20 μm to 300 μm.

3. The method of claim 1, wherein said two horizontal portions are of the same length.

4. The method of claim 1, of wherein said two horizontal portions, one is longer than the other.

5. The method of claim 1, wherein said second highly doped silicon wafer is of N+ type.

6. The method of claim 1, wherein said spring metal stripes are of zero intrinsic stress.

7. The method of claim 1, wherein said variety of techniques includes silicon anisotropic etch and silicon plasma assisted dry etch.

8. The method of claim 1, wherein said at least one trace metal layer is selected from Cr, Ti, Mo, Mo alloy, W.

9. The method of claim 1, wherein said insulating layer is selected from $Si_3N_4$, polyimide.

10. The method of claim 1, wherein said spring contacts are connected to the backside of the said substrate through said second openings, said routing metal traces, said first openings and said through wafer electrical connects.

11. The method of claim 1, wherein said spring metal stripes comprise of an adhesion metal layer at bottom, inner metal layer and top metal layer.

12. The method of claim 1, wherein said one or more layers electroplated or electroless plated further comprise an inner film layer and one or more outer layers, wherein a material used for said inner layer has a higher elastic modulus than that of said outer layers.

13. The method of claim 1, wherein said one or more layers electroplated or electroless plated is selected from the group of Co, Ni, Au or their alloy, Pt, Pd, Rh.

* * * * *